(12) United States Patent
Arabi

(10) Patent No.: US 6,501,278 B1
(45) Date of Patent: Dec. 31, 2002

(54) TEST STRUCTURE APPARATUS AND METHOD

(75) Inventor: Ahmad R. Arabi, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/896,861

(22) Filed: Jun. 29, 2001

(51) Int. Cl.[7] .............................................. G01R 31/11
(52) U.S. Cl. ........................................................ 324/533
(58) Field of Search ................................ 324/533, 642, 324/691, 696, 697, 724, 754, 758, 761

(56) References Cited

U.S. PATENT DOCUMENTS

| | | | | |
|---|---|---|---|---|
| 5,012,213 A | * | 4/1991 | Tsai | 333/247 |
| 5,219,827 A | * | 6/1993 | Higaki et al. | 505/210 |

OTHER PUBLICATIONS

Winslow, T.A., "Component Modeling for PCB Design", *Microwave, Application Notes*, 61–63, (Mar. 2000).

* cited by examiner

*Primary Examiner*—Michael Nghiem
(74) *Attorney, Agent, or Firm*—Schwegman, Lundberg, Woessner & Kluth, P.A.

(57) ABSTRACT

Test structure circuitry and apparatus, circuit boards, and testing systems are described, as well as methods to form such apparatus and circuit boards. The test structure apparatus is used for launching high frequency signals from a test instrument, such as a Time Domain Reflectometer (TDR), into circuitry under test, and includes a pair of launching conductors and a ground pad formed on the first surface of a substrate, or dielectric layer. A ground plane layer, formed on the second surface of the dielectric layer, is connected to the ground pad, which is typically formed so as to substantially surround some portion of the launching conductors. The test structure provides a matching impedance between the TDR probe tip, for example, and the circuit board or components under test.

28 Claims, 3 Drawing Sheets

TEST STRUCTURE APPARATUS AND METHOD

FIELD OF THE INVENTION

The present invention relates generally to testing and characterizing circuit boards, as well as the components mounted thereon. More particularly, the present invention relates to apparatus and methods which are used to characterize and test the performance of printed circuit boards and various components using a differential signal interface at frequencies above about one Gigahertz.

BACKGROUND INFORMATION

As circuit design clock speeds increase, and data rates approach one billion transfers per second, the radio frequency properties of each signal as it crosses a circuit board become all-important. Because high-speed signals traveling along a transmission line tend to reflect energy backward (toward their source) as they encounter a change in impedance, and the amount of reflected energy depends on the magnitude of the impedance change, it is often the reflected energy due to impedance changes that makes the difference between a circuit that works and one that does not.

Within conventional dynamic RAM circuits, a single data bit or pulse typically travels down a bus transmission line alone, and reaches its destination, such that any reflections caused by an impedance mismatch dissipate before the next bit is launched. In higher data rate environments, this is not necessarily the case.

For example, in some recent data bus circuitry designs, data is transported so rapidly that up to three bits of information may be in transit between a source and the destination along a particular circuit trace (such as between a memory controller and the memory it operates) at a given instant in time. At such speeds, the second and third bits must pass through any reflections generated by the first bit due to an impedance mismatch, such as that which may occur at the junction where the bit enters a connector. Such reflections degrade signal margins and cause timing errors, leading to data transmission failures. Therefore, in these high-speed signal propagation situations, it is absolutely essential to minimize impedance variations encountered within the circuit board and data processing circuitry.

One way of verifying the impedance characteristics of a particular component is to observe signal reflections from the component when high speed test signals are launched onto the associated circuit board. Test "coupons" (sample test areas) are therefore incorporated into circuit board designs to facilitate connection to impedance measurement tools. Such coupons are used to verify behavior of the printed circuit board (PCB) itself, as well as various attached circuit packages, sockets, and connectors.

The industry-standard tool used for circuit board impedance measurements is the Time Domain Reflectometer (TDR). TDR instruments make use of fast system risetimes and a high bandwidth to resolve features of circuit boards and their attached circuitry. A TDR typically takes measurements by using a probe to send a known pulse down the transmission medium (in this case a circuit board trace or differential pair of traces) and capturing the reflections that result. The heart of the TDR is an extremely high-bandwidth (20 GHz) sampling oscilloscope and fast-risetime sampling head with an integral step generator.

Therefore, in setting up for actual circuit board impedance measurements, the TDR probing approach is of great concern. Impedance matching is critical. In dense high-speed circuit areas, the space available to firmly attach a TDR probe is very limited. Yet probe connection integrity is essential. Any compromise in these areas will inevitably appear as an inaccurate TDR reading.

SMA connectors are sometimes used to couple TDR equipment to the circuit board for testing. However, this type of connector installation is usually less than satisfactory, since it contributes to an impedance mismatch between the probe and the PCB, and usually requires about one square inch of board surface area for attachment. Thus, the use of SMA connectors is often not an option for the designer.

Specially-designed microprobes are also available for TDR measurement applications. However, the conventional microprobe contact connection also contributes to impedance mismatch at high frequencies, such that microprobes are also less than ideal as a signal coupling device for test signals above about one Gigahertz.

Another difficulty involves launching differential test signals into a particular circuit or board design. With differential signals, two conductors are required: the first carries a true signal value, while the second carries the inverted signal value. Ideally, the differential system leads to complete cancellation of emitted noise. The receiver then rejects common-mode noise, and the result is a substantial improvement in both signaling speed and reduced emissions due to electromagnetic interference. High-speed designs tend to incorporate differential signaling, rather than single-ended methods, because higher data rates are possible, susceptibility to EMI is less, and power consumption is also typically less. However the problems encountered when testing high-speed differential interfaces are in effect doubled with regard to impedance mismatch problems and connector surface area requirements. While some approaches have been tested for launching single-ended, high-speed signals into circuit boards for testing purposes, no uniformly satisfactory apparatus or method is known for the convenient application of high-speed differential signals necessary to properly characterize high-speed differential interface circuitry.

Thus, there is a need in the art for test structure apparatus and methods which can be easily applied to launch differential test signals into circuit boards and components for high-speed signal performance characterization purposes. Such apparatus and methods should provide an optimal impedance match to minimize reflections, while using a minimum of circuit board real estate for connection to the circuitry under test.

DESCRIPTION OF THE PREFERRED EMBODIMENTS

Figure 1:
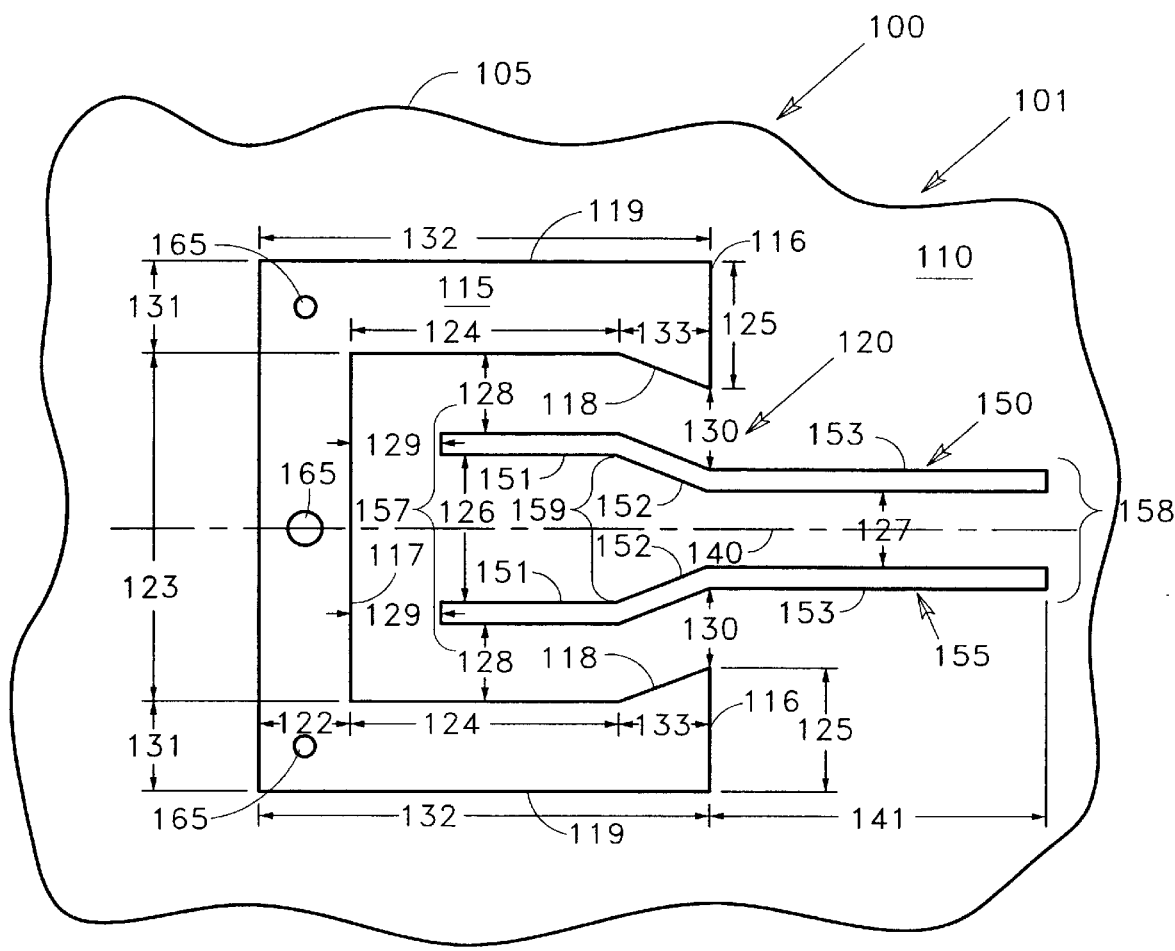
FIG. 1 is top, plan view of a test structure constructed according to the teachings of the present invention.

In the following detailed description of the preferred embodiments, reference is made to the accompanying drawings which form a part hereof, and in which are shown by way of illustration, and not of limitation, specific embodiments in which the invention may be practiced. In the drawings, like numerals describe substantially similar components throughout the several views. The embodiments illustrated are described in sufficient detail to enable those skilled in the art to practice the invention. Other embodiments may be utilized and derived therefrom, such that structural, logical, and electrical circuit substitutions and changes may be made without departing from the scope of the invention. The following detailed description, therefore, is not to be taken in a limiting sense, and the scope of the invention is defined only by the appended claims, along with the full range of equivalents to which such claims are entitled.

According to the teachings of the present invention, a test structure apparatus is described. The test structure generally includes a mirrored pair of launching conductors and a ground pad formed on the first surface of a substrate, or dielectric layer. A ground plane layer, formed on the second surface of the dielectric layer, is connected to the ground pad, which is typically formed so as to substantially surround some portion of the launching conductors. The test structure provides a matching impedance between a differential signal TDR probe tip, for example, and the circuit board or components under test. Advantages provided by this invention include minimal impedance discontinuity at high frequencies, and a total connection board surface area requirement that is about one-sixteenth that required by a single SMA connector.

Referring now to FIG. 1, a top, plan view of a test structure constructed according to the teachings of the present invention can be seen. The test structure 100 includes a substrate or dielectric layer 105 with a first surface 110. The dielectric layer 105 is typically of the type used for FR-4 circuit board material, and can be made from a fluororesin, a polynorbomene resin, a benzocyclobutene resin, a polyimide resin, an epoxy resin, or some combination of these. However, the dielectric layer 105 may also be made of many other types of relatively non-conductive materials, including various natural materials, such as rubber, or synthetic materials, including plastics and polymers. A ground pad 115 is formed within a region on the first surface 110 and electrically connected to a ground plane layer adjacent the second surface (see elements 260, 270 of FIG. 2, respectively, described hereinbelow) of the dielectric layer 105, typically using a plurality of through-hole vias 165. The ground pad preferably includes a groove 120 which, as will be discussed below, may be formed in a number of ways.

A first and second launching conductor 150, 155 are also formed adjacent the first surface 110. Each one of the launching conductors 150, 155 is typically disposed on the first surface 110 outside of the region bearing the ground pad 115, in the form of an "open funnel", as a mirror image of the other. For example, as can be seen in FIG. 1, the second launching conductor 155 is formed as a mirror image of the first launching conductor 150 as reflected about the axis of a center line 140.

Several dimensional features relative to constructing an operational version of the test structure 100 will now be discussed. It should be noted that the absolute value of the dimensions given, while useful in a particular impedance matching situation, are only a guide to many possible implementations of the invention. That is, the dimensions and relative size of various elements of the invention may be scaled up or down to adjust the impedance of the differential interface as desired in a particular testing configuration, as is well known to those skilled in the art.

For example, to provide a differential impedance of approximately 100 ohms for the test structure 100, the ground pad 115 may have a length 132 of about 5.1 millimeters (mm), or about 0.2 inches (in.), which includes the depth 124 of the groove 120 and length 133 of the receding portions 118 (about 2.5 mm/0.1 in. and about 1.3 mm/0.05 in., respectively), plus the length 122 of the ground pad 115 base (about 1.3 mm/0.05 in.). The ground pad 115 may have a total height of about 4.3 mm/0.17 in., which includes the width 131 of the arms 119 (about 1.3 mm/0.05 in. each), and the width 123 of the groove 120, which is about 1.8 mm/0.07 in. The ends 116 of the arms 119 have a width 125 of about 1.5 mm/0.059 in., which includes the receding portions 118 of the arms 119.

In accordance with the dimensions of the ground pad 115 described above, the first and second launching conductors 150, 155 are typically formed to have a substantially uniform width and are separated from each other by a greater or first separation distance 126 of less than about 1.3 mm/0.05 in., and more preferably, by about 1.1 mm/0.042 in. The conductors 150, 155 are separated from each other by a lesser or second separation distance 127 of greater than about 0.05 mm/0.002 in., and preferably, by about 0.15 mm/0.006 in. The inlet portion 157 formed by the mirrored pair of transmitting ends 151 of each one of the first and second launching conductors 150, 155 is disposed within the groove 120 so as to be substantially evenly surrounded by the groove 120. In other words, the spacing 129 between the transmitting ends 151 and the throat 117 should be about 0.15 mm/0.006 in. in this example, and the spacing 128 between the transmitting ends 151 and the arms 119 should also be about 0.15 mm/0.006 in. However, proximate to the transition portion 159, which includes the substantially non-parallel, mirrored pair of tapered segments 152 of the launching conductors 150, 155, the groove 120 preferably includes receding portions 118 attached to the arms 119, which are spaced apart from the launching conductors 150, 155 by a separation distance 128 of about 0.15 mm/0.006 in. where the transmitting ends 151 join the tapered segments 152, and recede away to a separation distance 130 of about 0.38 mm/0.015 in. at the ends 116 of the arms 119. Finally, the first and second launching conductors 150, 155 typically include an outlet portion 158 formed by the mirrored pair of receiving ends 153 which have a length 141 of about 12.7 mm/0.5 in. As can be seen in FIG. 1, the pair of transmitting ends 151 is joined to the pair of receiving ends 153 by the pair of tapered segments 152.

Figure 2:
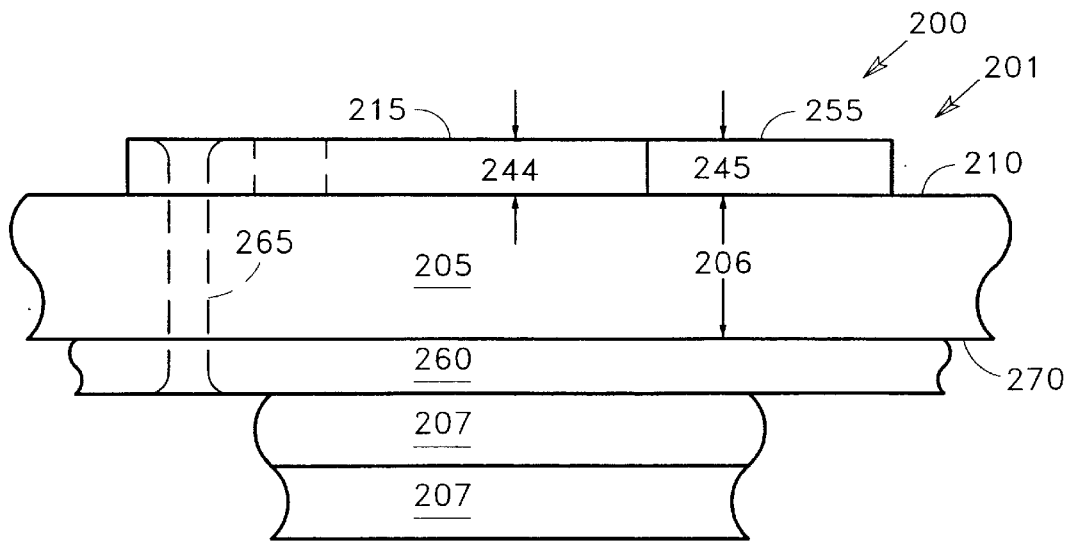
FIG. 2 is a side, plan view of the test structure illustrated in FIG. 1

Referring now to FIG. 2, a side, plan view of the test structure illustrated in FIG. 1 can be seen. As shown in FIG. 2, the test structure 200 includes the dielectric layer 205, with a first surface 210 and a second surface 270. Adjacent the second surface is a ground plane layer 260, having a typical thickness of at least about 0.02 mm/0.001 in., or more. However, the absolute thickness of the ground plane layer 260 is not critical for performance of the test structure 200.

The dielectric layer 205 has a substantially uniform thickness 206 of about 0.13 mm/0.005 in., which is typically scaled to thicknesses 206 of about 0.05 mm/0.002 in. to about 0.2 mm/0.008 in. Those skilled in the art will realize that changing the thickness 206 of the dielectric layer also affects the differential impedance presented by the test structure 200. The launching conductors, of which only the second launching conductor 255 is shown in FIG. 2 (see also elements 150, 155 in FIG. 1), are typically formed so as to have a substantially uniform thickness 245 of about 0.3 mm/0.012 in., which is typically scaled to thicknesses 245 of about 0.025 mm/0.001 in. to about 0.05 mm/0.002 in. Similarly, the ground pad 215 is formed so as to have a substantially uniform thickness 244 of about 0.3 mm/0.012 in., which is scaled to thicknesses 244 of about 0.025 mm/0.001 in. to about 0.05 mm/0.002 in., and which may be selected to be substantially equal to the thickness 245 of the launching conductor 255 (and elements 150, 155 in FIG. 1). In FIG. 2 can also be seen a side view of one of the vias 265 by which the ground pad 215 may be connected to the ground plane layer 260. The test structure 200 may include one or more other layers 207 as an integral part of its construction, which layers 207 may be conducting or non-conducting, as desired and appropriate.

Figure 3:
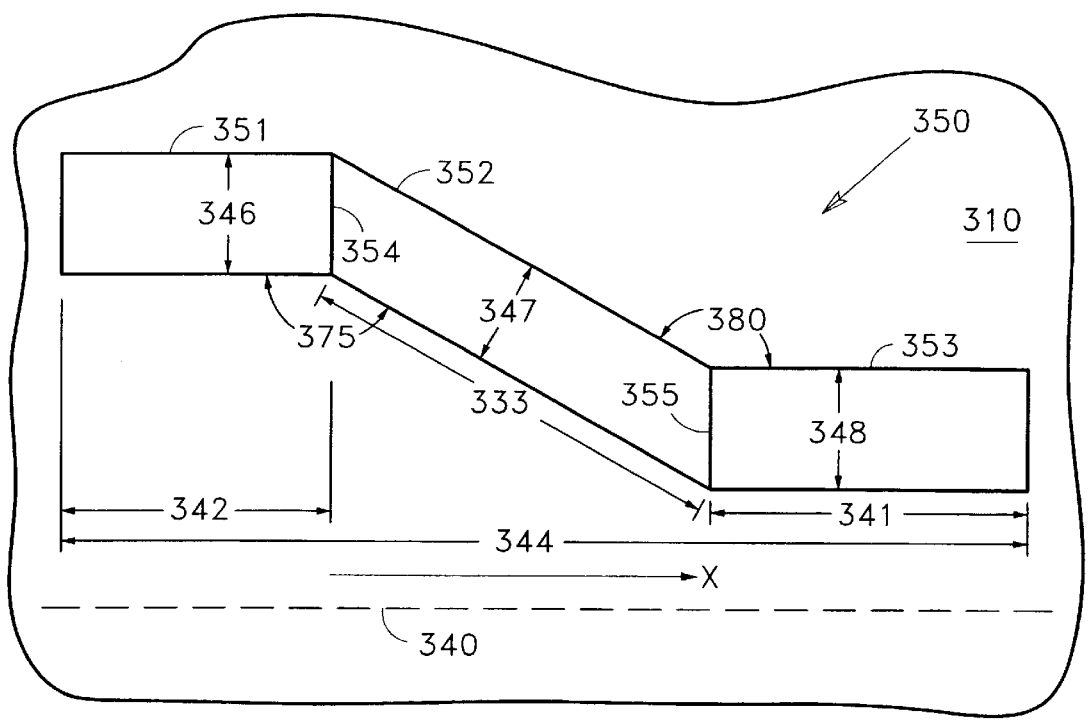
FIG. 3 is a top, plan view of a single launching conductor element of the test structure of the present invention.

Referring now to FIG. 3, a top, plan view of a single launching conductor element constructed according to the teachings of the present invention can be seen. The launching conductor 350 may be similar to or identical to the first launching conductor 150 shown in FIG. 1, and similar to or identical to the mirror image of the second launching conductor 155 (also shown in FIG. 1). Typically, each launching conductor 350 is formed so as to have a substantially uniform width, such that the width 346 of the transmitting end or first conductive segment 351 is substantially equal to the width 347 of the tapered segment 352, which in turn is substantially equal to the width 348 of the receiving end or second conductive segment 353. For testing using the 100 ohm differential impedance discussed previously, the widths 346, 347, and 348 are preferably selected to be about 0.2 mm/0.008 in., which is typically scaled from about 0.1 mm/0.004 in. to about 0.3 mm/0.012 in.

The launching conductors 350 are usually formed with the first conductive segment 351 terminated by a first substantially obtuse angular connection 375 to one end 354 of the tapered segment 352. In turn, the second conductive segment 353 is usually formed so as to be substantially parallel to the first conductive segment 351, such that the second conductive segment 353 is terminated by a second substantially obtuse angular connection 380 to the other end 355 of the tapered segment 352. It should be noted that tapering the spacing of the launching conductor 350 toward the axis of the centerline 340, using the tapered segment 352, is necessary to preserve the continuity of the impedance throughout the length of the segments 351, 352, and 353. It should also be noted that, since the launching conductors 350 are typically formed as paired mirror images about the axis of the center line 340 (refer to elements 140, 150, and 155 in FIG. 1), the transmitting end 151, 351 of the first launching conductor 150, 350 will typically lie in the plane of the first surface 110, 310 so as to be substantially parallel to the transmitting end 151, 351 of the second launching conductor 155, at the same time as the receiving end 153, 353 of the first launching conductor 150, 350 lies in the plane of the first surface 110, 310 so as to be substantially parallel to the receiving end 153, 353 of the second launching conductor 155.

While the first and second substantially obtuse angles 375, 380 are usually selected to be substantially equal, ranging from about 95 degrees to about 175 degrees, this is not necessarily the case. Each of the substantially obtuse angles 375, 380 may differ from the other, if desired. However, the first substantially obtuse angle 375 in one of the launching conductors 350 (e.g. element 150 in FIG. 1) will almost always be equal to the first substantially obtuse angle 375 in the other (mirror image) launching conductor 350 (e.g. element 155 in FIG. 1). Similarly, the second substantially obtuse angle 380 in one of the launching conductors 350 will also almost always be equal to the second substantially obtuse angle 380 in the other (mirror image) launching conductor 350. In any case, the linear length 344 along the "X" direction of the launching conductor will of course change as the angles 375, 380 are changed, while the linear lengths 342, 333, and 341 of the segments 351, 352, and 353, respectively, will remain relatively unchanged. With reference to the exemplary dimensions discussed previously, the linear length 344 of the launching conductor 350 will be about 17.8 mm/0.7 in., with scaling linear length 344 values from about 2.5 mm/0.1 in. to about 23 mm/0.9 in.

Referring now to FIGS. 1 and 2, it should be noted that a circuit board 101, 201 may also be constructed according to the teachings of the present invention. The circuit board 101, 201 includes a substantially planar dielectric layer 105, 205 having a first surface 110, 210 and a second surface 270 (not shown in FIG. 1). The circuit board 101, 201 also includes a ground plane layer 260 (not shown in FIG. 1) fixedly attached to the second surface 270, and a ground pad 115, 215 fixedly attached to the first surface. The ground pad 115, 215 is typically connected to the ground plane layer 260 using one or more vias 165, 265. The circuit board 101, 201 also includes first and second launching conductors 150, 155 (255) adjacent the first surface 110, 210 and formed with an inlet portion 157 joined to an outlet portion 158 by a tapered portion 159. As described previously, the second launching conductor 155, 255 is typically formed as a mirror image of the first launching conductor 150 about the axis of the center line 140. Further, the ground pad 115, 215 of the circuit board 101, 201 usually includes a groove 120 which is formed such that the inlet portion 157 formed by the transmitting ends 151 of the first and second launching conductors 150, 155 (255) is disposed substantially within the groove 120.

Figure 4:
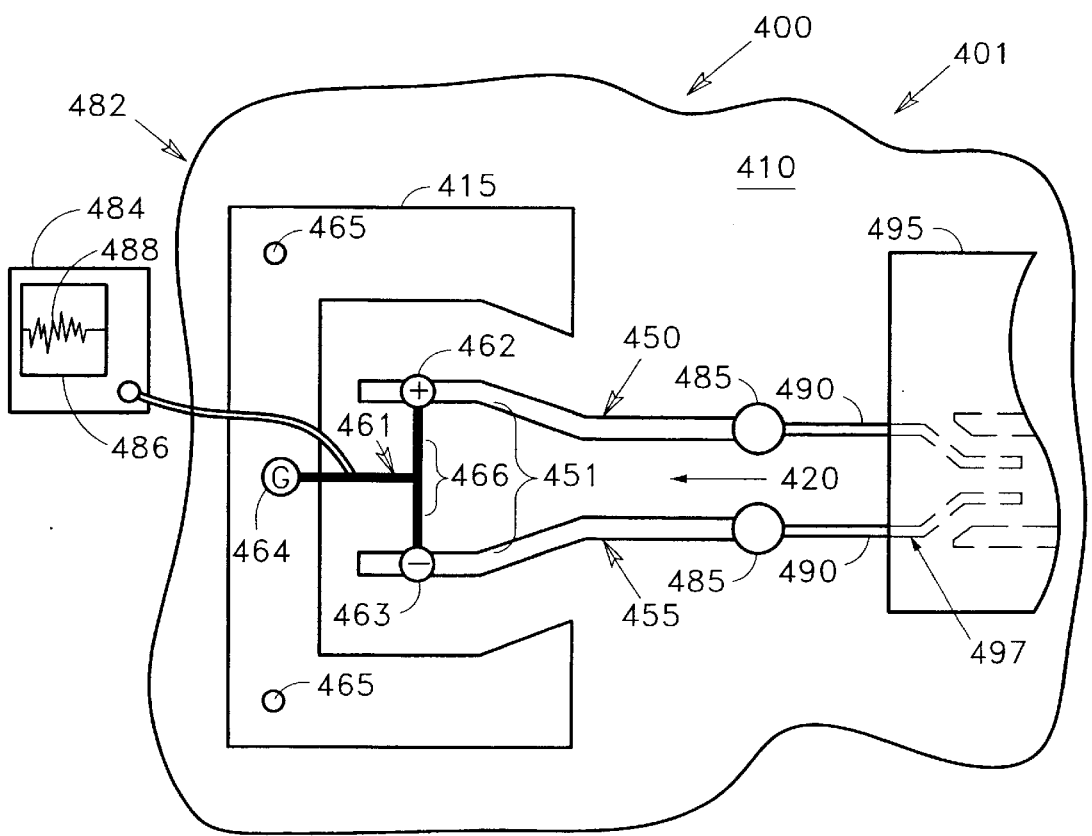
FIG. 4 is a top plan view of a circuit board and testing system constructed according to the teachings of the present invention.

Referring now to FIG. 4, a top plan view of a circuit board and testing system constructed according to the teachings of the present invention can be seen. Here the circuit board 401, which includes a ground pad 415 and launching conductors 450, 455 formed adjacent the first surface 410, also has a plurality of conductive elements 485, similar to or identical to integrated circuit through-hole pads or surface mounting pads, or circuit wiring traces, adjacent the first surface 410. The circuit board 410 also includes a circuit 495 electrically connected to the conductive elements 485, typically using one or more leads 490. The circuit 495 may be a receiver circuit, a driver circuit, a connector, a socket, a microprocessor, or a memory circuit, all of which are well known to those skilled in the art. For trace characterization purposes, the circuit 495 may even include a receiving test structure 497 constructed according to the teachings of the present invention.

Thus, a testing system 482 may also be constructed and operated according to the teachings of the present invention, and includes a test structure 400, which is similar to or identical to the test structure 100 shown in FIG. 1. The testing system 482 also includes a microprobe 461 that has a differential signal output 466, which includes a positive signal lead 462 and a negative signal lead 463. The microprobe also has a signal ground 464.

In use, the microprobe differential signal output 466 is operationally connected or coupled to the inlet portion formed by the transmitting ends 451 of the first and second launching conductors 450, 455, while the signal ground 464 is operationally connected or coupled to the ground pad 415 (as well as to the ground plane, typically by way of one or more vias 465). As a matter of clarification, it is particularly easy to see in FIG. 4 that the inlet portion formed by the transmitting ends 451 of the first and second launching conductors 450, 455 (formed as an "open funnel" shape) are substantially disposed within the groove 420 of the ground pad 415.

A TDR instrument 484, similar to or identical to a Tektronix 11801C with an SD-24 TDR sampling head, is used to launch a differential signal 488, typically having a frequency within a range of about 1 Gigahertz to about 20 Gigahertz, or higher, into the microprobe 461. If the test structure 400, has been scaled appropriately (such that the structure 400 is constructed and adapted to receive the differential signal 488), the differential signal 488 will propagate into the test structure 400 with a minimum of impedance discontinuity, such that the reflected signal from the circuit 495, which might be a connector for example, will truly reveal the ability of the circuit 495 differential interface to properly handle high frequency signals, such as the differential signal 488, as observed on the display 486. It should be noted that during laboratory testing, the impedance discontinuity contributed by a test structure fabricated according to the teachings of the invention was measured to be on the order of five ohms or less. This is clearly better than results typically obtained using a through-hole mounted SMA connector, which often introduces an impedance discontinuity of about 10–15 ohms (and requires on the order of 16–32 times the amount of circuit board surface area for connecting the probe). While edge-mounted SMA connectors may be used to launch high frequency test signals with impedance discontinuities on the order of a few ohms, they still require a great deal of precious circuit board real estate for probe attachment.

It should also be noted that the testing system 482 can be used to characterize the performance of traces on the circuit board 401 itself. As mentioned previously, the circuit 495 may include a receiving test structure 497, connected to the transmitting test structure 400 by way of a conductive element 485, which may be a signal trace to be characterized. Thus, the TDR can launch a signal 488 into the test structure 400, such that the signal 488 can then propagate down the trace 485, and on into the receiving test structure 497. A second microprobe (not shown) can then be placed onto the receiving test structure 497 so as to capture the signal 488 after propagation down the trace, and the resulting received signal 488 can be analyzed on the display 486. The circuit board 101, 201, and 401 may also be fabricated for use as a stand-alone test coupon, well known to those skilled in the art.

It will be understood by those of ordinary skill in the art that the embodiments shown in FIGS. 1–4 illustrate a circuit board and testing system in which the novel signal launching circuitry of the present invention, having a mirrored pair of conductors formed in an open-funnel shape, having an inlet surrounded by a ground pad, and supported by a dielectric layer with a ground plane connected to the ground pad, is included. Thus, one of ordinary skill in the art will understand upon reading this description that the test structure circuitry of the present invention can be used in applications other than for circuit boards and testing systems, and thus, the invention is not to be so limited. The illustrations of a circuit board 101, 201, and 401 in FIGS. 1, 2, and 4, as well as the testing system 482 in FIG. 4, are intended to provide a general understanding of some applications which may be served by the structure and circuitry of the present invention, and are not intended to serve as a complete description of all the elements and features of circuit boards or systems which make use of the novel test structure circuitry and structures described herein.

Applications which may include the novel test structure circuitry of the present invention as described in this document include electronic circuitry used in high-speed computers, arrays of memory modules and other circuit cards, device drivers, power modules, communication circuitry, modems, processor modules, memory integrated circuits, embedded processors, and application-specific modules, including multilayer, multi-chip modules. Such circuitry may fuirther be included as sub-components within a variety of electronic systems, such as televisions, cellular telephones, personal computers, aircraft, and others.

FIGS. 1–4 are similarly useful in presenting the application of various methods which may be carried out according to the teachings of the present invention. Those of ordinary skill in the art will realize that various elements of the circuit boards and systems of the present invention may be assembled and used in accordance with the structures described in the various figures. However, for clarity, at least one embodiment of a method conducted according to the teachings of the present invention will be specifically illustrated.

Figure 5:
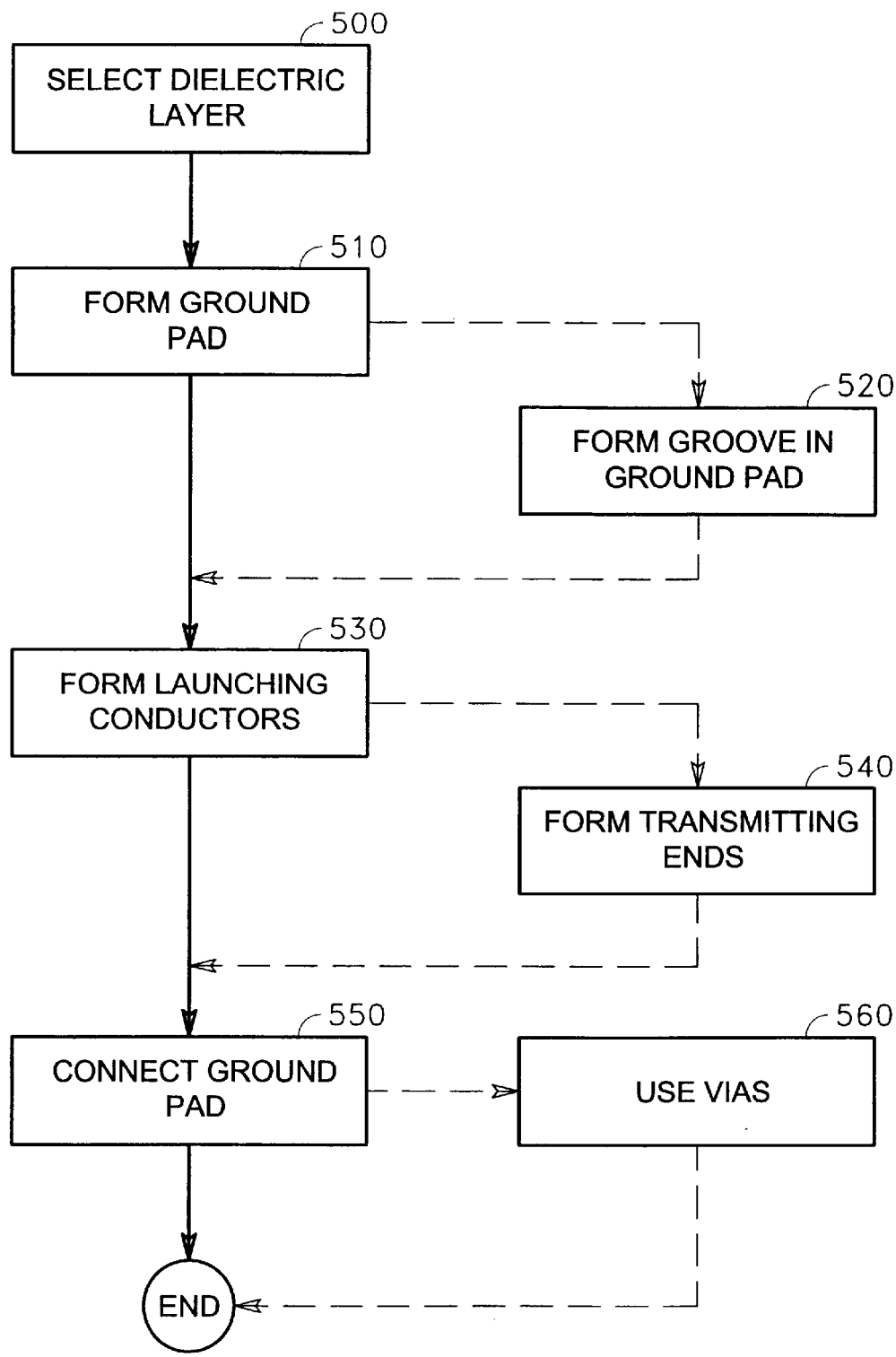
FIG. 5 is a flow chart diagram of a method of forming a test structure according to the teachings of the present invention.

Referring now to FIG. 5, a flow chart diagram of a method of forming a test structure according to the teachings of the present invention can be seen. The method of forming a test structure includes selecting a dielectric layer having a first surface and a conductive second surface in step 500, and forming a conductive ground pad on the first surface in step 510. As noted in step 520, forming the conductive ground pad in step 510 may include forming the conductive ground pad so as to include a groove.

The method then continues with forming the first and second launching conductors in step 530, such that each one of the launching conductors is formed on the first surface outside the region bearing the ground pad, such that the first and second launching conductors are formed generally parallel to and separated from each other by a first distance in the inlet portion, tapering toward each other in a transition portion, and parallel to and separated from each other by a second distance (which is less than the first distance) in the outlet portion. Step 530 may in turn include forming the first and second launching conductors such that the inlet portion (formed by the transmitting ends of the first and second launching conductors) is substantially disposed within the groove (formed in step 520), as is shown in step 540. It should be noted that the groove is usually formed so as to substantially evenly surround the inlet portion of the open funnel formed by the first and second launching conductors, as discussed above.

The method may then conclude with connecting the ground pad to the conductive second surface of the dielectric layer in step 550. Alternatively, the method may conclude by connecting the ground pad to the conductive second surface using a plurality of vias extending through the dielectric layer, as shown in step 560.

Thus, the present invention provides novel test structure circuitry, apparatus, circuit boards, and testing systems. According to the teachings of the invention, methods are also disclosed to form such circuitry and circuit boards. The invention obviates the need for large edge-mounted SMA connectors to launch differential test signals on to circuit boards for characterizing board performance, as well as various components that may be mounted thereon, greatly simplifying the testing, measurement, and characterization process. The invention also greatly improves the accuracy of, and contributes uniformity to, TDR measurements, and other high frequency test and characterization measurements, since the ability to minimize impedance discontinuities while maintaining a desired differential impedance up to the measurement point with respect to differential testing signals is provided.

Although specific embodiments have been illustrated and described herein, it will be appreciated by those of ordinary skill in the art that any arrangement which is calculated to achieve the same purpose may be substituted for the specific embodiment shown. This application is intended to cover any and all adaptations or variations of the present invention. It is to be understood that the above description has been made in an illustrative fashion, and not a restrictive one. Combinations of the above embodiments, and other embodiments not specifically described herein will be apparent to those of skill in the art upon reviewing the above description. The scope of the invention includes any other applications in which the above structures, circuitry, and fabrication and assembly methods are used. The scope of the invention should be determined with reference to the appended claims, along with the full range of equivalents to which such claims are entitled.

What is claimed is:

1. A test structure, comprising:
   a dielectric layer having a first surface and a second surface;
   a ground plane layer disposed on the second surface;
   a ground pad formed on a region of the first surface and electrically connected to the ground plane layer; and
   a first and a second launching conductors, wherein each one of the launching conductors is disposed on the first surface outside the region bearing the ground pad, the first and second launching conductors generally parallel to and separated from each other by a first distance in an inlet portion, tapering toward each other in a transition portion, and parallel to and separated from each other by a second distance less than the first distance in an outlet portion.

2. The test structure of claim 1, wherein the dielectric layer is selected from a group consisting of fluororesins, polynorbomene resins, benzocyclobutene resins, polyimide resins, and epoxy resins.

3. The test structure of claim 1, wherein each one of the first and second launching conductors have a substantially uniform thickness.

4. The test structure of claim 3, wherein the ground pad has a ground pad thickness substantially equal to the substantially uniform thickness of the first and second launching conductors.

5. The test structure of claim 1, wherein each one of the first and second launching conductors have a substantially uniform width.

6. The test structure of claim 1, wherein the first and second launching conductors are constructed and adapted for receiving a differential signal.

7. The test structure of claim 6, wherein the differential signal is launched through a microprobe having a differential output coupled to the first and second launching conductors, and wherein the microprobe has a ground coupled to the ground plane.

8. The test structure of claim 7, wherein the differential signal has a frequency of about 1 Gigahertz to about 20 Gigahertz.

9. The test structure of claim 1, wherein the first distance is less than about 1.3 mm.

10. The test structure of claim 1, wherein the second distance is greater than about 0.05 mm.

11. The test structure of claim 1, wherein the inlet portion is substantially disposed within a groove.

12. The test structure of claim 11, wherein the groove is shaped so as to substantially evenly surround the inlet portion, and wherein the groove is shaped so as to recede away from the transition portion.

13. The test structure of claim 1, wherein each one of the first and second launching conductors has a length of from about 2.5 mm to about 23 mm.

14. The test structure of claim 1, wherein each one of the first and second launching conductors includes at least one substantially obtuse angle between about 95 degrees and about 175 degrees.

15. A test structure, comprising:
    a dielectric layer having a first surface including a centerline and a second surface;
    a ground plane layer adjacent the second surface;
    a ground pad adjacent the first surface and connected to the ground plane layer; and
    a first launching conductor adjacent the first surface and forming an open funnel shape disposed about the centerline including an inlet portion joined to an outlet portion by a transition portion, wherein the inlet portion includes a pair of substantially parallel segments mirrored about the centerline and spaced apart by a first distance, wherein the outlet portion includes a pair of substantially parallel segments mirrored about the centerline and spaced apart by a second distance, wherein the transition portion includes a pair of substantially non-parallel tapered segments mirrored about the centerline, wherein the inlet portion is joined to the outlet portion by the transition portion, and wherein the first distance is greater than the second distance.

16. The test structure of claim 15, wherein the ground pad includes a groove, and wherein the inlet portion is substantially disposed within the groove.

17. The test structure of claim 16, wherein the groove is shaped so as to substantially evenly surround the inlet portion, and wherein the groove is shaped so as to recede away from the transition portion.

18. A circuit board, comprising:
    a substantially planar dielectric layer having a first surface and a second surface;
    a ground plane layer fixedly attached to the second surface;
    a ground pad disposed on a region of the first surface, wherein the ground pad is fixedly attached to the first surface and connected to the ground plane layer; and
    a first and a second launching conductors, wherein each one of the launching conductors is disposed on the first surface outside the region bearing the ground pad, the first and second launching conductors generally parallel to and separated from each other by a first distance in an inlet portion, tapering toward each other in a transition portion, and parallel to and separated from each other by a second distance less than the first distance in an outlet portion.

19. The circuit board of claim 18, formed as a stand-alone test coupon.

20. The circuit board of claim 18, further comprising:
    a conductive element adjacent the first surface; and
    a connector electrically connected to the conductive element.

21. The circuit board of claim 18, further comprising:

a conductive element adjacent the first surface; and a signal launcher electrically connected to the conductive element.

22. A testing system, comprising:

a microprobe including a differential signal output and a signal ground;

a dielectric layer having a first surface and a second surface;

a ground plane layer adjacent the second surface;

a ground pad adjacent the first surface and disposed within a region of the first surface, wherein the ground pad is connected to the ground plane layer and coupled to the signal ground; and a first and a second launching conductors, wherein each one of the launching conductors is disposed on the first surface outside the region bearing the, ground pad, the first and second launching conductors generally parallel to and separated from each other by a first distance in an inlet portion, tapering toward each other in a transition portion, and parallel to and separated from each other by a second distance less than the first distance in an outlet portion, and wherein the differential signal output is coupled to the inlet portion.

23. The testing system of claim 22, wherein the ground pad includes a groove, and wherein the inlet portion is substantially disposed within the groove.

24. The testing system of claim 22, wherein the groove is shaped so as to substantially evenly surround the inlet portion and so as to recede away from the transition portion.

25. A method of forming a test structure, comprising:

selecting a dielectric layer having a first surface and a conductive second surface;

forming a conductive ground pad adjacent the first surface;

forming first and a second launching conductors adjacent the first surface, wherein each one of the launching conductors is formed on the first surface outside the region bearing the ground pad, and wherein the first and second launching conductors are formed generally parallel to and separated from each other by a first distance in an inlet portion, tapering toward each other in a transition portion, and parallel to and separated from each other by a second distance less than the first distance in an outlet portion; and connecting the ground pad to the conductive second surface.

26. The method of claim 25, wherein connecting the ground pad to the conductive second surface includes connecting the conductive ground pad to the conductive second surface using a plurality of vias extending through the dielectric layer.

27. The method of claim 25, wherein forming the conductive ground pad on the surface includes forming the conductive ground pad so as to include a groove, and wherein forming first and second launching conductors includes forming each one of the first and second launching conductors so that the inlet portion is substantially disposed within the groove.

28. The method of claim 27, wherein forming the conductive ground pad so as to include a groove includes forming the groove so as to substantially evenly surround the inlet portion.

* * * * *